US008390310B2

United States Patent
Hamanaka

(10) Patent No.: US 8,390,310 B2
(45) Date of Patent: Mar. 5, 2013

(54) TEST SYSTEM AND TEST METHOD OF SEMICONDUCTOR INTEGRATED CIRCUIT

(75) Inventor: Shinsuke Hamanaka, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 286 days.

(21) Appl. No.: 12/801,207

(22) Filed: May 27, 2010

(65) Prior Publication Data
US 2010/0301895 A1 Dec. 2, 2010

(30) Foreign Application Priority Data
Jun. 2, 2009 (JP) ................. 2009-133162

(51) Int. Cl.
*G01R 31/28* (2006.01)
*G01R 31/26* (2006.01)

(52) U.S. Cl. .............. 324/763.01; 324/762.01
(58) Field of Classification Search .. 324/754.01–754.3, 324/762.01–762.1, 750.01–750.3; 438/14–18; 257/48
See application file for complete search history.

(56) References Cited

U.S. PATENT DOCUMENTS
7,675,309 B2 * 3/2010 Wu et al. ............... 324/750.3
7,795,895 B2 * 9/2010 Hsieh et al. ........... 324/762.02

FOREIGN PATENT DOCUMENTS
JP        2003-167034        6/2003

* cited by examiner

*Primary Examiner* — Tung X Nguyen
(74) *Attorney, Agent, or Firm* — McGinn IP Law Group, PLLC

(57) ABSTRACT

Provided is a test system of a semiconductor integrated circuit including an output device and an input device for conducting an input/output characteristics test of the output device and the input device inside the semiconductor integrated circuit. In the system, a transmission line provided in a test board where the semiconductor integrated circuit is mounted on establishes a wired connection between an external terminal of one circuit of one of the output device and the input device and external terminals of a plurality of circuits of another one of the output device and the input device.

6 Claims, 11 Drawing Sheets

TEST SYSTEM AND TEST METHOD OF SEMICONDUCTOR INTEGRATED CIRCUIT

INCORPORATION BY REFERENCE

This application is based upon and claims the benefit of priority from Japanese patent application No. 2009-133162, filed on Jun. 2, 2009, the disclosure of which is incorporated herein in its entirety by reference.

BACKGROUND

1. Field of the Invention

The present invention relates to a test system and a test method of a semiconductor integrated circuit.

2. Description of Related Art

In large-scale-integrations (LSIs) used in various systems, internal operation and input/output are becoming faster with increasing sophistication and higher levels of integration. There is thus a demand for a high-speed tester compatible with the increasing LSI operating speed. However, a low-cost test method using a hitherto used tester is desired in terms of cost reduction.

As a low-cost test method of a high-speed I/O made up of a high-speed input device and a high-speed output device, a loop-back test is used that connects an external input terminal of the high-speed input device and an external output terminal of the high-speed output device through a transmission line.

FIG. 11 shows a schematic view of a test system 1 for a loop-back test of a semiconductor integrated circuit including high-speed input/output devices disclosed in Japanese Unexamined Patent Application Publication No. 2003-167034. The test system 1 sets a measurement target semiconductor integrated circuit LSI1 on a test board 2 and performs measurement. The semiconductor integrated circuit LSI1 includes high-speed input devices RX1 to RX4, high-speed output devices TX1 to TX4, test pattern generation devices TPG1 to TPG4 and test pattern check devices TPC1 to TPC4.

The test board 2 is provided with loop-back paths LPB1 to LPB4, and external output terminals of the high-speed output devices TX1 to TX4 and external input terminals of the high-speed input devices RX1 to RX4 are connected through the loop-back paths LPB1 to LPB4, respectively.

An operation of the test system 1 is described briefly. Output signals corresponding to test patterns generated by the test pattern generation devices TPG1 to TPG4 are output to the loop-back paths LPB1 to LPB4 from the high-speed output devices TX1 to TX4. The output signals are then input to the high-speed input devices RX1 to RX4 through the loop-back paths LPB1 to LPB4. After that, the test pattern check devices TPC1 to TPC4 check the occurrence of an error or the like on the signals input to the high-speed input devices RX1 to RX4.

In this manner, by using the loop-back paths LPB1 to LPB4, a self-test can be performed inside the semiconductor integrated circuit LSI1 with use of the test pattern generation devices TPG1 to TPG4, the test pattern check devices TPC1 to TPC4, the high-speed output devices TX1 to TX4 and the high-speed input devices RX1 to RX4 incorporated in the semiconductor integrated circuit LSI1. It is thereby possible to conduct a characteristics test of the high-speed I/O without need to prepare a high-speed tester including high-speed input/output devices, thus enabling reduction of the test cost.

SUMMARY

However, in the test system 1 shown in FIG. 11, it is necessary to connect the high-speed output devices TX1 to TX4 and the high-speed input devices RX1 to RX4 respectively in one-to-one correspondence. It is thus unable to conduct a characteristics test of the high-speed I/O when the number of high-speed output devices and the number of high-speed input devices mounted on the semiconductor integrated circuit are different.

A first exemplary aspect of the present invention is a test system of a semiconductor integrated circuit including an output device and an input device for conducting an input/output characteristics test of the output device and the input device inside the semiconductor integrated circuit. In the system, a transmission line provided in a test board where the semiconductor integrated circuit is mounted on establishes a wired connection between an external terminal of one circuit of one of the output device and the input device and external terminals of a plurality of circuits of another one of the output device and the input device.

A second exemplary aspect of the present invention is a test method of a semiconductor integrated circuit that conducts an input/output characteristics test of an output device and an input device of the semiconductor integrated circuit inside the semiconductor integrated circuit. In the method, the input/output characteristics test of the output device and the input device is conducted by establishing a wired connection between one circuit of one of the output device and the input device and a plurality of circuits of another one of the output device and the input device.

In the test system of a semiconductor integrated circuit according to the exemplary aspect of the present invention described above, it is possible to conduct an input/output characteristics test of one circuit of either one of the output device or the input device and a plurality of circuits of the other one of the output device or the input device.

With the test method of a semiconductor integrated circuit according to the exemplary aspect of the present invention described above, it is possible to conduct a characteristics test of a high-speed I/O even when the number of high-speed output devices and the number of high-speed input devices mounted on a measurement target semiconductor integrated circuit are different.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
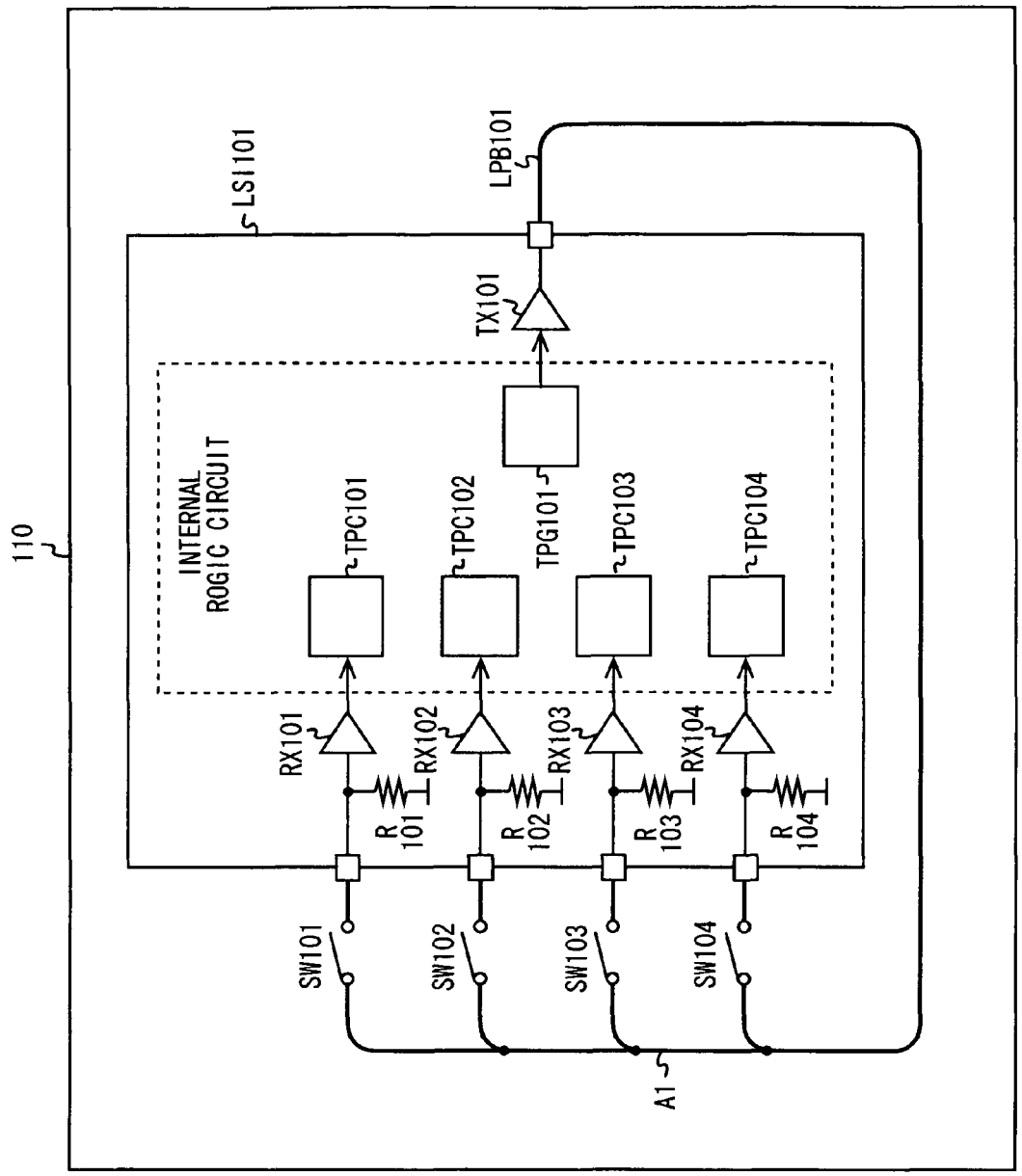
FIG. 1 is a schematic view of a test system according to a first exemplary embodiment.

A first exemplary embodiment of the present invention is described hereinafter in detail with reference to the drawings. FIG. 1 shows a schematic view of a test system 100 for a loop-back test of a semiconductor integrated circuit according to the first exemplary embodiment.

The test system 100 sets a test target semiconductor integrated circuit LSI101 on a test board 110 and conducts a characteristics test. The semiconductor integrated circuit LSI101 includes high-speed input devices RX101 to RX104, a high-speed output device TX101, a test pattern generation device TPG101 and test pattern check devices TPC101 to TPC104. One ends of terminating resistors R101 to R104 are respectively connected to external input terminals of the high-speed input devices RX101 to RX104.

The test pattern generation device TPG 101 generates a test pattern for conducting a built-in self-test (BIST) inside the LSI101. The test pattern generation device TPG101 includes a pseudorandom number pattern generator or the like composed of a linear feedback shift register (LFSR) or the like, and the test pattern is generated by the pseudorandom number pattern generator.

The high-speed output device TX101 outputs a transmission signal corresponding to the test pattern generated by the test pattern generation device TPG101 (which is referred to hereinafter as a test pattern transmission signal) to the external output terminal. The high-speed output device TX101 includes a synchronizer, an output driver or the like. The synchronizer adjusts the timing between an internal clock of the LSI101 and a transmission clock, and the output driver outputs the test pattern transmission signal to the external output terminal in response to the transmission clock.

The test pattern transmission signal output from the high-speed output device TX101 is input to external input terminals of the respective high-speed input devices RX101 to RX104. The high-speed input devices RX101 to RX104 respectively include an input driver, a synchronizer or the like. The input driver receives the test pattern transmission signal input through the external input terminal, and the synchronizer synchronizes the test pattern transmission signal with an internal clock and regenerates the test pattern. The high-speed output device TX101 and the high-speed input devices RX101 to RX104 make up a high-speed I/O. Further, one ends of the terminating resistors R101 to R104 for impedance matching are respectively connected to the external input terminals. A ground voltage or a power supply voltage is connected to the other ends of the terminating resistors R101 to R104.

The test pattern check devices TPC101 to TPC 104 check the test patterns respectively regenerated by the high-speed input devices RX 101 to RX104 and determine the presence or absence of the occurrence of an error based on a check result. The test pattern check devices TPC101 to TPC104 may be regarded as one check device. Further, the test pattern generation device TPG101 and the test pattern check devices TPC101 to TPC104 are included in an internal logic circuit of the semiconductor integrated circuit LSI101.

The test board 110 is provided with a loop-back path LPB101 (transmission line). The loop-back path LPB101 establishes a wired connection between the external output terminal of the high-speed output device TX101 and the external input terminals of the high-speed input devices RX101 to RX104.

Further, the loop-back path LPB101 includes selection switches SW101 to SW104. The selection switches SW101 to SW104 are connected between the external input terminals of the high-speed input devices RX101 to RX104 and a node A1 of the loop-back path LPB101.

A test operation of the test system 100 as described above is described hereinbelow. First, before starting BIST of the semiconductor integrated circuit LSI101, the selection switch SW101 is set to the on-state, and the selection switches SW102 to SW104 are set to the off-state. Next, BIST of the test target semiconductor integrated circuit LSI101 is started. The high-speed output device TX101 generates the test pattern transmission signal based on the test pattern generated by the test pattern generation device TPG101 and outputs the signal. The test pattern transmission signal is transmitted to the high-speed input devices RX101 to RX104 through the loop-back path LPB 101. However, because the selection switches SW102 to SW104 are in the off-state, the test pattern transmission signal is input only to the high-speed input device RX101.

The high-speed input device RX101 regenerates the test pattern from the test pattern transmission signal, and the test pattern check device TPC101 checks the test pattern and makes determination about the occurrence of an error.

Then, the selection switch SW102 is set to the on-state, and the selection switches SW101, SW103 and SW104 are set to the off-state. Next, BIST of the semiconductor integrated circuit LSI101 is started in the same manner as when the selection switch SW101 is set to the on-state. The high-speed output device TX101 generates the test pattern transmission signal based on the test pattern generated by the test pattern generation device TPG101 and outputs the signal. In this case, because only the selection switch SW102 is in the on-state, the test pattern transmission signal is input only to the high-speed input device RX102.

The high-speed input device RX102 regenerates the test pattern from the test pattern transmission signal, and the test pattern check device TPC102 checks the test pattern and makes determination about the occurrence of an error.

After that, the selection switch SW103 is set to the on-state, and the selection switches SW101, SW102 and SW104 are set to the off-state, and then BIST of the semiconductor integrated circuit LSI101 is started. The high-speed output device TX101 generates the test pattern transmission signal based on the test pattern generated by the test pattern generation device TPG101 and outputs the signal. In this case, because only the selection switch SW103 is in the on-state, the test pattern transmission signal is input only to the high-speed input device RX103.

The high-speed input device RX103 regenerates the test pattern from the test pattern transmission signal, and the test pattern check device TPC103 checks the test pattern and makes determination about the occurrence of an error.

Finally, the selection switch SW104 is set to the on-state, and the selection switches SW101 to SW103 are set to the off-state, and then BIST of the semiconductor integrated circuit LSI101 is started. The high-speed output device TX101 generates the test pattern transmission signal based on the test pattern generated by the test pattern generation device TPG101 and outputs the signal. In this case, because only the selection switch SW104 is in the on-state, the test pattern transmission signal is input only to the high-speed input device RX104.

The high-speed input device RX104 regenerates the test pattern from the test pattern transmission signal, and the test pattern check device TPC104 checks the test pattern and makes determination about the occurrence of an error.

By the above operation, the test system 100 can conduct a characteristics test of the high-speed I/O (the high-speed output device TX101 and the high-speed input devices RX101 to RX104) included in the test target semiconductor integrated circuit LSI101.

Figure 2:
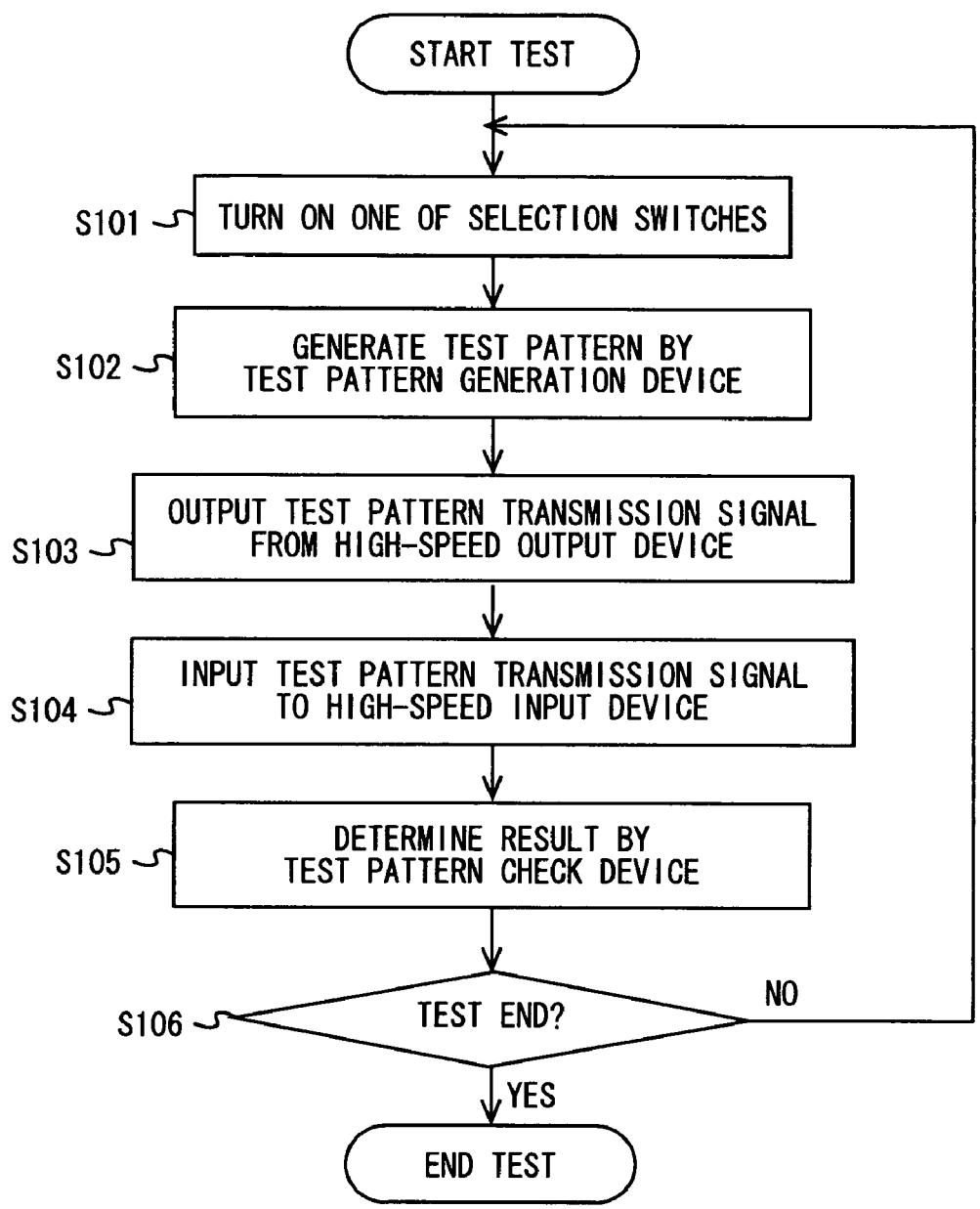
FIG. 2 is a flowchart of a test operation of the test system according to the first exemplary embodiment.

FIG. 2 shows a flowchart of a test operation of the test system 100 described above. First, one of the selection switches SW101 to SW104 is set to the on-state (S101). Next, the test pattern generation device TPG101 generates a test pattern (S102). The high-speed output device TX101 outputs the test pattern transmission signal (S103). The test pattern transmission signal is input to the high-speed input device connected to the selection switch that is set to the on-state in the step S101 (S104). The test pattern check device corresponding to the high-speed input device that has received the test pattern transmission signal checks the test pattern and determines a result (S105). If a characteristics test is conducted on the whole high-speed I/O (the high-speed output device TX101 and the high-speed input devices RX101 to RX104), the test ends (YES in S106). If, on the other hand, a characteristics test is not conducted on the whole high-speed I/O, the process returns to the step S101 and conducts a characteristics test with another high-speed input device and the high-speed output device TX101 (NO in S106).

Figure 11:
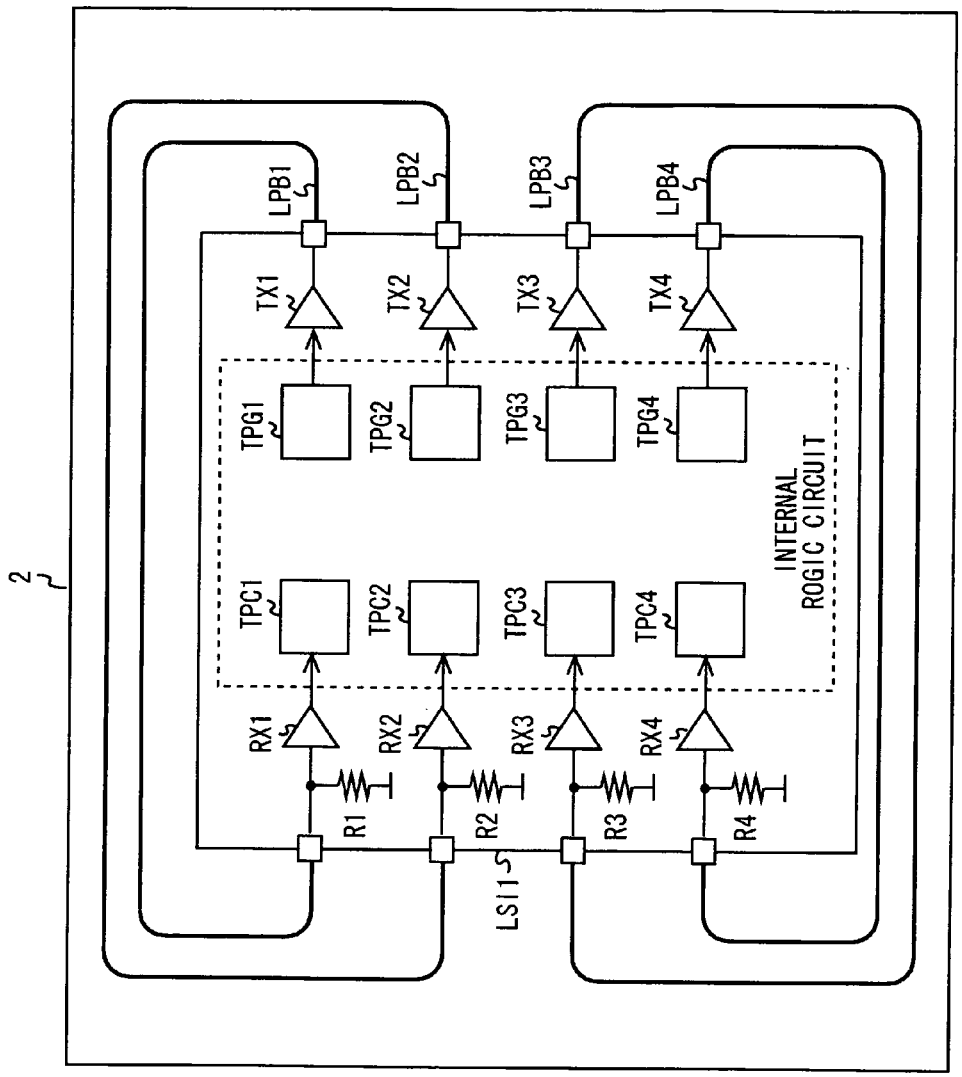
FIG. 11 is a schematic view of a test system according to prior art.

In the test system 1 according to prior art shown in FIG. 11, it is necessary to connect the high-speed output devices TX1 to TX4 and the high-speed input devices RX1 to RX4 respectively in one-to-one correspondence. Therefore, if the number of high-speed output devices and the number of high-speed input devices mounted on the semiconductor integrated circuit LSI1 are different, it has been unable to conduct a characteristics test of the high-speed I/O made up of the high-speed output devices and the high-speed input devices.

On the other hand, in the test system 100 according to the first exemplary embodiment, even when a test target circuit includes one high-speed output device TX101 and a plurality of high-speed input devices RX101 to RX104 like the test target semiconductor integrated circuit LSI101, it is possible to conduct a characteristics test of the high-speed I/O by controlling the on-state and the off-state of the selection switches SW101 to SW104. Thus, even if a test target semiconductor integrated circuit has different numbers of high-speed output devices and high-speed input devices, it is possible to conduct a characteristics test of the high-speed I/O.

Further, in the case of conducting a characteristics test with the high-speed output device TX101 and the high-speed input device RX101 as described above, for example, the selection switch SW101 is set to the on-state, and the other election switches are set to the off-state. In this case, because the selection switches SW102 to SW104 are in the off-state, the effects of auxiliary capacitance of the high-speed input devices RX102 to RX104 and the terminating resistors R102 to R104 are shielded from the path between the high-speed output device TX101 and the high-speed input device RX101. Therefore, a characteristics test can be conducted under substantially the same test conditions as the case where the high-speed output device and the high-speed input device are connected in one-to-one correspondence as in the test system 1.

Further, a characteristics test of the high-speed I/O may be conducted by setting a plurality of selection switches, rather than one of the selection switches SW101 to SW104, to the on-state. However, in this case, it is necessary to adjust the resistance values of the terminating resistors R101 to R104 in accordance with the transmission line characteristics when a plurality of selection switches are set to the on-state.

Figure 3:
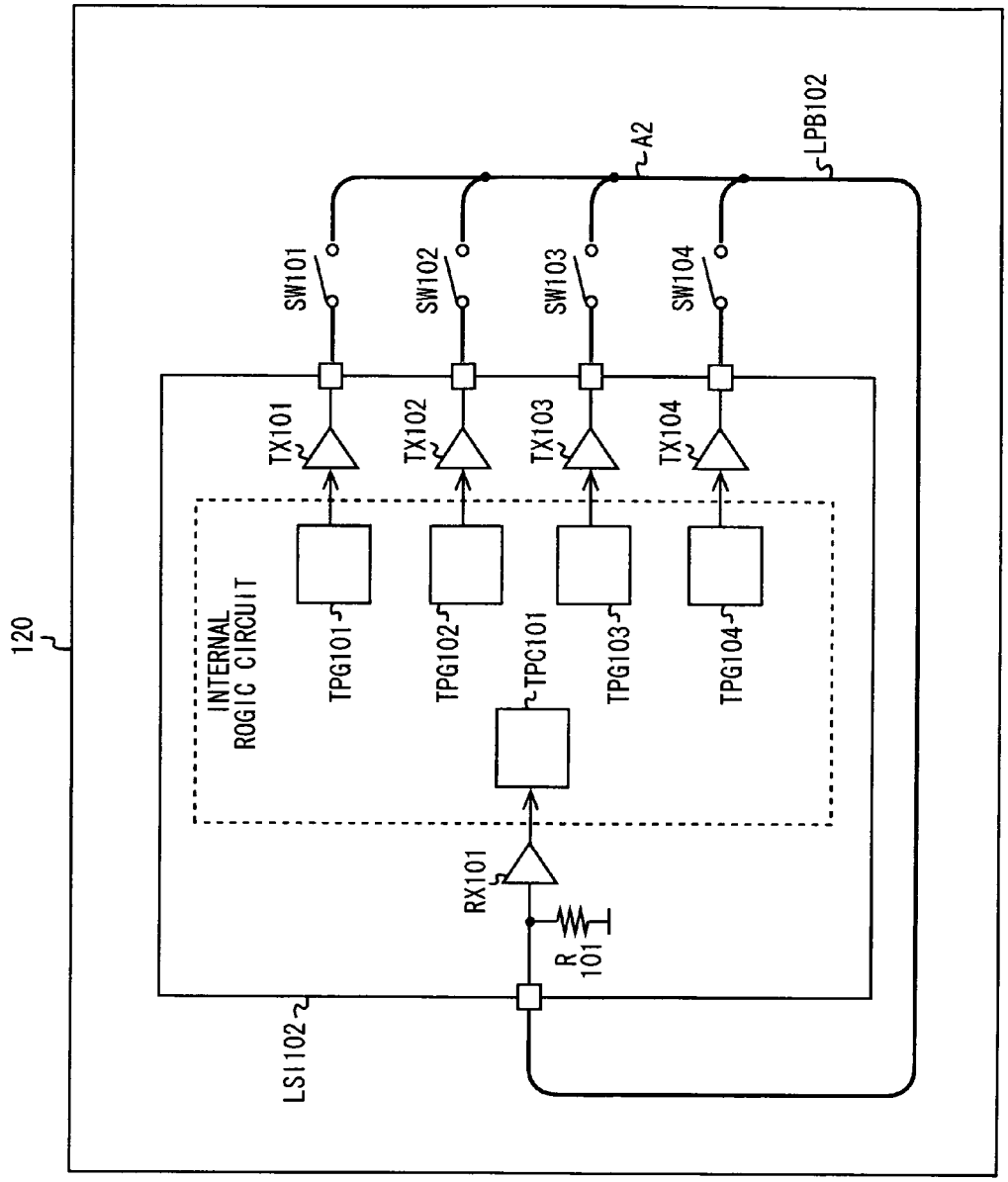
FIG. 3 is a schematic view of another test system according to the first exemplary embodiment.

The case where the semiconductor integrated circuit LSI101, which is a test target of the test system 100, includes a plurality of high-speed input devices with respect to one high-speed output device is described above by way of illustration. On the contrary, a semiconductor integrated circuit may include a plurality of high-speed output devices with respect to one high-speed input device. For example, FIG. 3 shows a test system 101 in such a case. As shown in FIG. 3, the test system 101 sets a test target semiconductor integrated circuit LSI102 on a test board 120 provided with a loop-back path LPB102 and conducts a characteristics test. The semiconductor integrated circuit LSI102 includes a high-speed input device RX101, high-speed output devices TX101 to TX104, test pattern generation devices TPG101 to TPG104 and a test pattern check device TPC101. The high-speed output devices TX102 to TX104 have the same configuration as the high-speed output device TX101. Further, the test pattern generation devices TPG102 to TPG104 have the same configuration as the test pattern generation device TPG101. The loop-back path LPB102 includes selection switches SW101 to SW104.

In this case, the high-speed input device RX101 and the plurality of high-speed output devices TX101 to TX104 are connected wired by the loop-back path LPB102. Further, the selection switches SW101 to SW104 as described above are connected between a node A2 and external output terminals of the high-speed output devices TX101 to TX104. In this case also, it is possible to conduct a characteristics test of the high-speed I/O in the same manner as in the test system 100 by controlling the on-state and the off-state of the selection switches SW101 to SW104 respectively corresponding to the high-speed output devices TX101 to TX104. In this configuration, it is possible to conduct a characteristics test of the high-speed I/O even when the test system 101 has different numbers of high-speed output devices and high-speed input devices, just like the test system 100 described above.

Second Exemplary Embodiment

Figure 4:
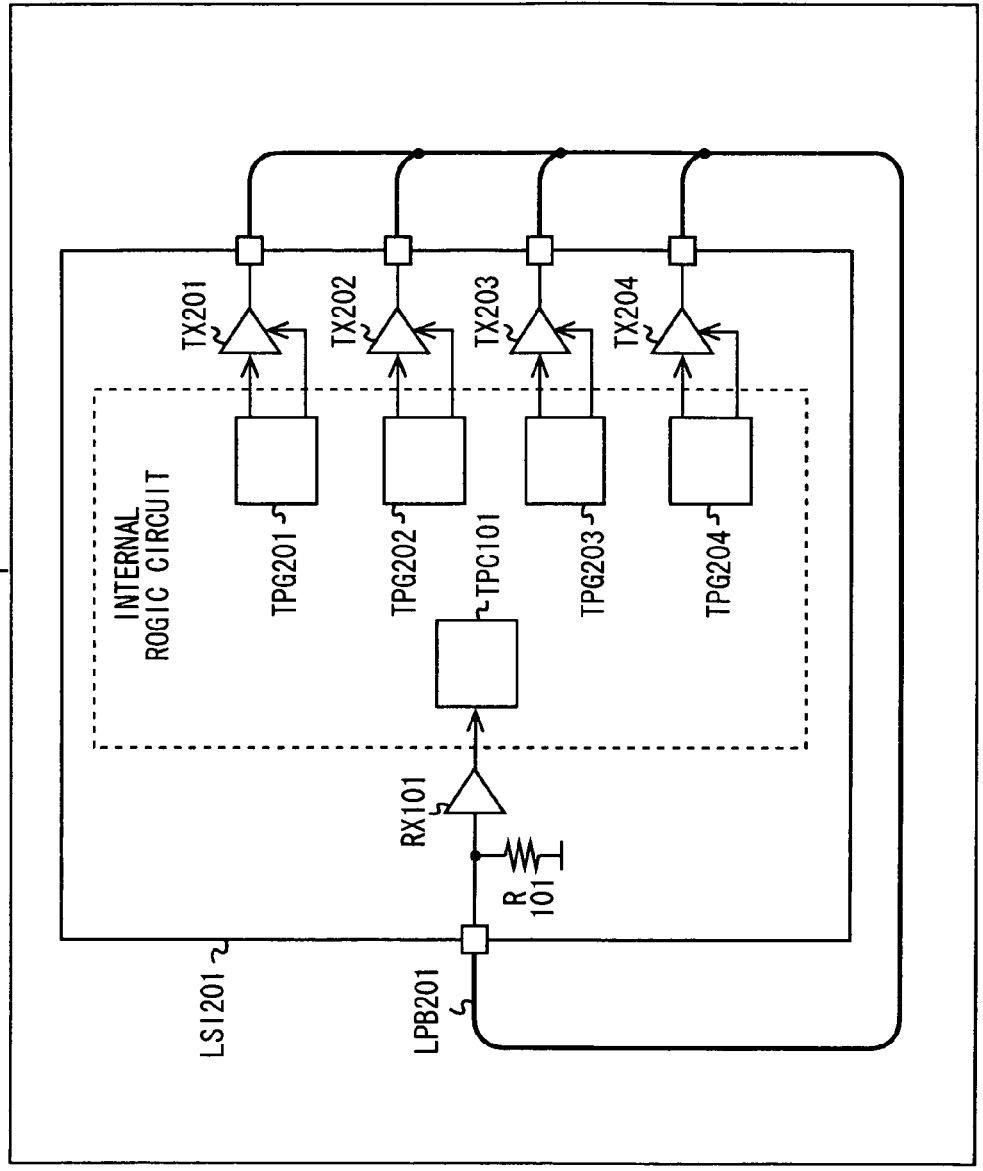
FIG. 4 is a schematic view of a test system according to a second exemplary embodiment.

A second exemplary embodiment of the present invention is described hereinafter in detail with reference to the drawings. FIG. 4 shows a schematic view of a test system 200 for a loop-back test of a semiconductor integrated circuit according to the second exemplary embodiment.

The test system 200 sets a test target semiconductor integrated circuit LSI201 on a test board 210 and conducts a characteristics test of a high-speed I/O. The semiconductor integrated circuit LSI201 includes a high-speed input device RX101, high-speed output devices TX201 to TX204, test pattern generation devices TPG201 to TPG204 and a test pattern check device TPC101. One end of a terminating resistor R101 is connected to an external input terminal of the high-speed input device RX101. A ground voltage or a power supply voltage is connected to the other end of the terminating resistor R101. Further, the test board 210 is provided with a loop-back path LPB201.

In FIG. 4, the elements denoted by the same reference symbols as in FIG. 1 or 3 are the same or similar elements as those shown in FIG. 1 or 3. The test system 200 is different from the test system 100 according to the first exemplary embodiment in that the semiconductor integrated circuit LSI201, which is a test target, includes a plurality of high-speed output devices with respect to one high-speed input device. In the second exemplary embodiment, the difference from the first exemplary embodiment is mainly described, and a redundant description is omitted.

The test pattern generation devices TPG201 to TPG204 respectively generate test patterns for conducting BIST inside the LSI201. Further, the test pattern generation devices TPG201 to TPG204 respectively output drive control signals to the high-speed output devices TX201 to TX204. The other functions are basically the same as those of the test pattern generation device TPG101 according to the first exemplary embodiment.

The high-speed output devices TX201 to TX204 respectively output test pattern transmission signals corresponding to the test patterns generated by the test pattern generation devices TPG201 to TPG204 to the external output terminals. Further, enable/disable of the test pattern transmission signals is controlled according to the drive control signals output from the test pattern generation devices TPG201 to TPG204.

For example, for disabling, an output of an output driver is set to Hi-Z by blocking supply of a power supply voltage of the output driver or turning off an output-stage transistor, for example. On the other hand, for enabling, the test pattern transmission signal is output by supplying a power supply voltage to the output driver, for example. It is assumed that test patterns are generated so as to enable one of the high-speed output devices TX201 to TX204 and disable the other three by the drive control signals output from the test pattern generation devices TPG201 to TPG204. The test pattern generation devices TPG201 to TPG204 may be regarded as one test pattern generation device.

The high-speed input device RX101 and the test pattern check device TPC101 have the same configurations and functions as those described in the first exemplary embodiment.

The test board 210 is provided with the loop-back path LPB201. The loop-back path LPB201 establishes a wired connection between the high-speed output devices TX201 to TX204 and the high-speed input device RX101.

A test operation of the test system 200 as described above is described hereinbelow. First, before starting BIST of the semiconductor integrated circuit LSI201, the high-speed output device TX201 is enabled by the drive control signal from the test pattern generation device TPG201. The other high-speed output devices TX202 to TX204 are disabled by the drive control signals from the test pattern generation devices TPG202 to TPG204, and outputs become high impedance (Hi-Z). Next, BIST of the test target semiconductor integrated circuit LSI201 is started. Because only the high-speed output device TX201 is enabled, the high-speed output device TX201 generates the test pattern transmission signal based on the test pattern generated by the test pattern generation device TPG201 and outputs the signal. The test pattern transmission signal is transmitted to the high-speed input device RX101 through the loop-back path LPB201. The high-speed input device RX101 regenerates the test pattern from the test pattern transmission signal, and the test pattern check device TPC101 checks the test pattern and makes determination about the occurrence of an error.

Then, only the high-speed output device TX202 is enabled by the drive control signal from the test pattern generation device TPG202. BIST of the test target semiconductor integrated circuit LSI201 is thereby started again. The high-speed output device TX202 generates the test pattern transmission signal based on the test pattern generated by the test pattern generation device TPG202 and outputs the signal. The test pattern transmission signal is transmitted to the high-speed input device RX101 through the loop-back path LPB201. The high-speed input device RX101 regenerates the test pattern from the test pattern transmission signal, and the test pattern check device TPC101 checks the test pattern and makes determination about the occurrence of an error.

After that, only the high-speed output device TX203 is enabled by the drive control signal from the test pattern generation device TPG203. BIST of the test target semiconductor integrated circuit LSI201 is thereby started again. The high-speed output device TX203 generates the test pattern transmission signal based on the test pattern generated by the test pattern generation device TPG203 and outputs the signal. The test pattern transmission signal is transmitted to the high-speed input device RX101 through the loop-back path LPB201. The high-speed input device RX101 regenerates the test pattern from the test pattern transmission signal, and the test pattern check device TPC101 checks the test pattern and makes determination about the occurrence of an error.

Finally, only the high-speed output device TX204 is enabled by the drive control signal from the test pattern generation device TPG204. BIST of the test target semiconductor integrated circuit LSI201 is thereby started again. The high-speed output device TX204 generates the test pattern transmission signal based on the test pattern generated by the test pattern generation device TPG204 and outputs the signal. The test pattern transmission signal is transmitted to the high-speed input device RX101 through the loop-back path LPB201. The high-speed input device RX101 regenerates the test pattern from the test pattern transmission signal, and the test pattern check device TPC101 checks the test pattern and makes determination about the occurrence of an error.

By the above operation, the test system 200 can conduct a characteristics test of the high-speed I/O (the high-speed output devices TX201 to TX204 and the high-speed input device RX101) included in the test target semiconductor integrated circuit LSI201.

Figure 5:
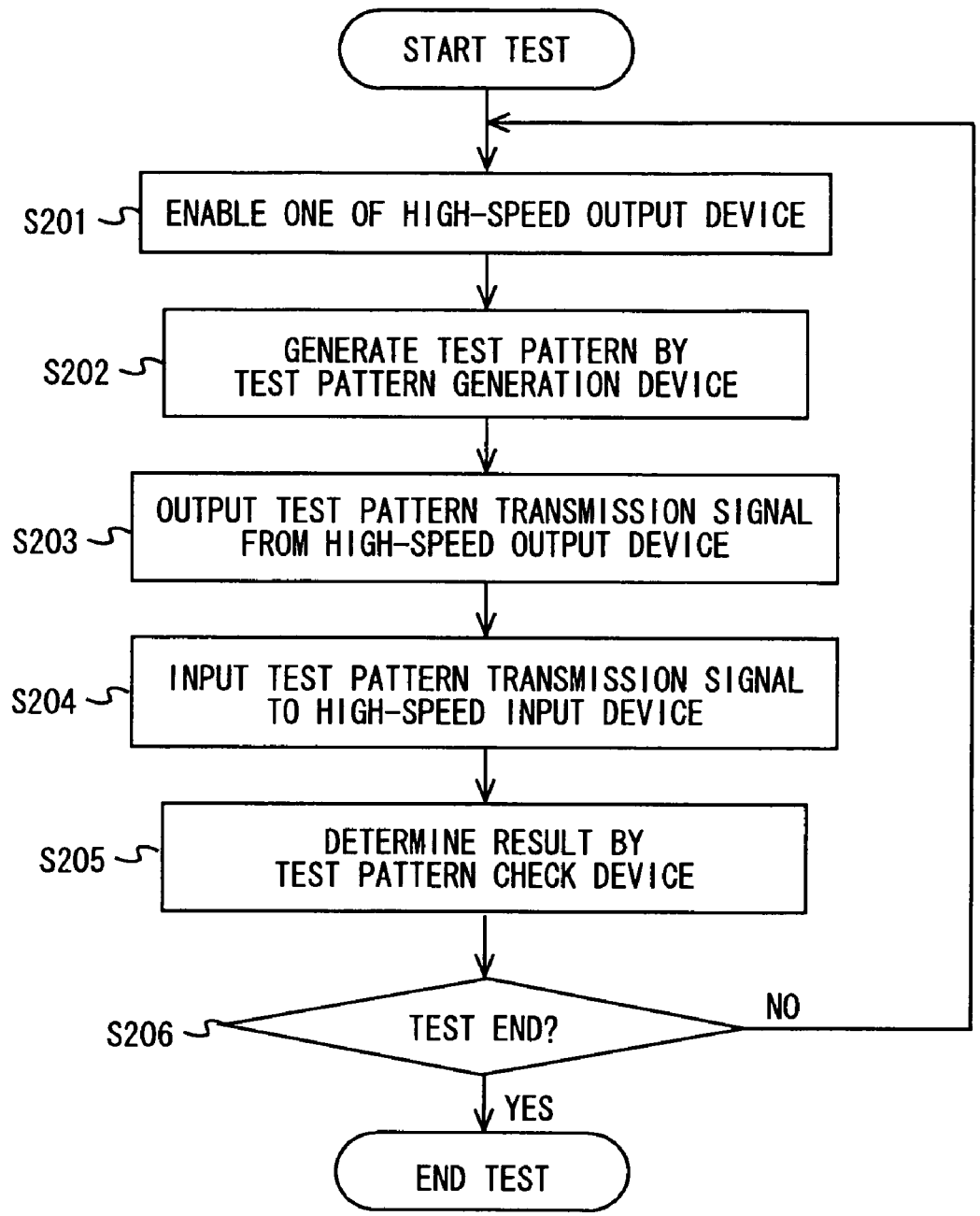
FIG. 5 is a flowchart of a test operation of the test system according to the second exemplary embodiment.

FIG. 5 shows a flowchart of a test operation of the test system 200 described above. First, one of the high-speed output devices TX201 to TX204 is enabled by the drive control signal (S201). Next, at least one of the test pattern generation devices TPG201 to TPG204 corresponding to the high-speed output device enabled in the step S201 generates a test pattern (S202). The enabled high-speed output device outputs the test pattern transmission signal (S203). The test pattern transmission signal is input to the high-speed input device RX101 (S204). The test pattern check device TPC101 checks the test pattern and determines a result (S205). If a characteristics test is conducted on the whole high-speed I/O (the high-speed output devices TX201 to TX204 and the high-speed input device RX101), the test ends (YES in S206). If, on the other hand, a characteristics test is not conducted on the whole high-speed I/O, the process returns to the step S201 and conducts a characteristics test with another high-speed output device and the high-speed input device RX101 (NO in S206).

In the above-described test system 200, even in the case where the test target semiconductor integrated circuit includes a plurality of high-speed output devices TX201 to TX204 with respect to one high-speed input device RX101, it is possible to conduct a characteristics test of the high-speed I/O by controlling enable/disable of the high-speed output devices. Thus, even if a test target semiconductor integrated circuit has different numbers of high-speed output devices and high-speed input devices, it is possible to conduct a characteristics test of the high-speed I/O as in the first exemplary embodiment.

Figure 6:
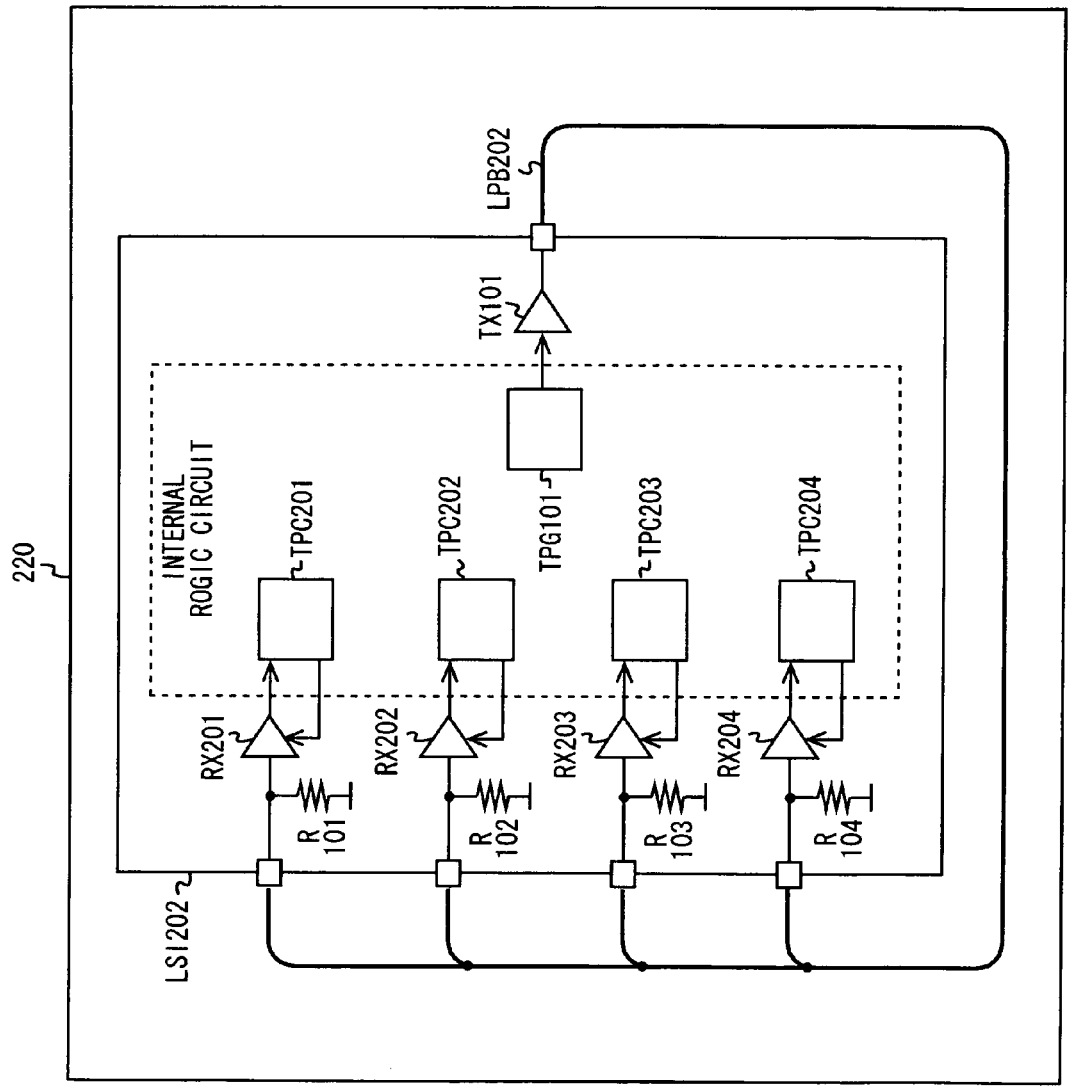
FIG. 6 is a schematic view of another test system according to the second exemplary embodiment.

The case where the semiconductor integrated circuit LSI201, which is a test target of the test system 200, includes one high-speed input device with respect to a plurality of high-speed output devices is described above by way of illustration. On the contrary, a semiconductor integrated circuit may include one high-speed output device with respect to a plurality of high-speed input devices. For example, FIG. 6 shows a test system 201 in such a case. As shown in FIG. 6, the test system 201 sets a test target semiconductor integrated circuit LSI202 on a test board 220 provided with a loop-back path LPB202 and conducts a characteristics test. The semiconductor integrated circuit LSI202 includes high-speed input devices RX201 to RX204, a high-speed output device TX101, a test pattern generation device TPG101 and test pattern check devices TPC201 to TPC204.

In this case, however, enable/disable of the high-speed input devices RX201 to RX204 is controlled, differently from the test system 200. For example, for disabling, an input of an input driver is set to Hi-Z by blocking supply of a power supply voltage of the input driver of the high-speed input devices RX201 to RX204 or turning off an input-stage transistor, for example. Further, enable/disable of the high-speed input devices RX201 to RX204 may be controlled by the test pattern check devices TPC201 to TPC204.

In this case also, the high-speed output device TX101 and the plurality of high-speed input devices RX201 to RX204 are connected wired by the loop-back path LPB202. In this configuration, it is possible to conduct a characteristics test of the high-speed I/O even when the test system 201 has different numbers of high-speed output devices and high-speed input devices, just like the test system 200 described above. Note that, in this case, a characteristics test of the high-speed I/O may be conducted by enabling a plurality of high-speed input devices rather than enabling only one of the high-speed input devices RX201 to RX204 as described above. In this case, however, it is necessary to adjust the resistance values of the terminating resistors R101 to R104 in accordance with the transmission line characteristics when a plurality of high-speed input devices are enabled.

Third Exemplary Embodiment

Figure 7:
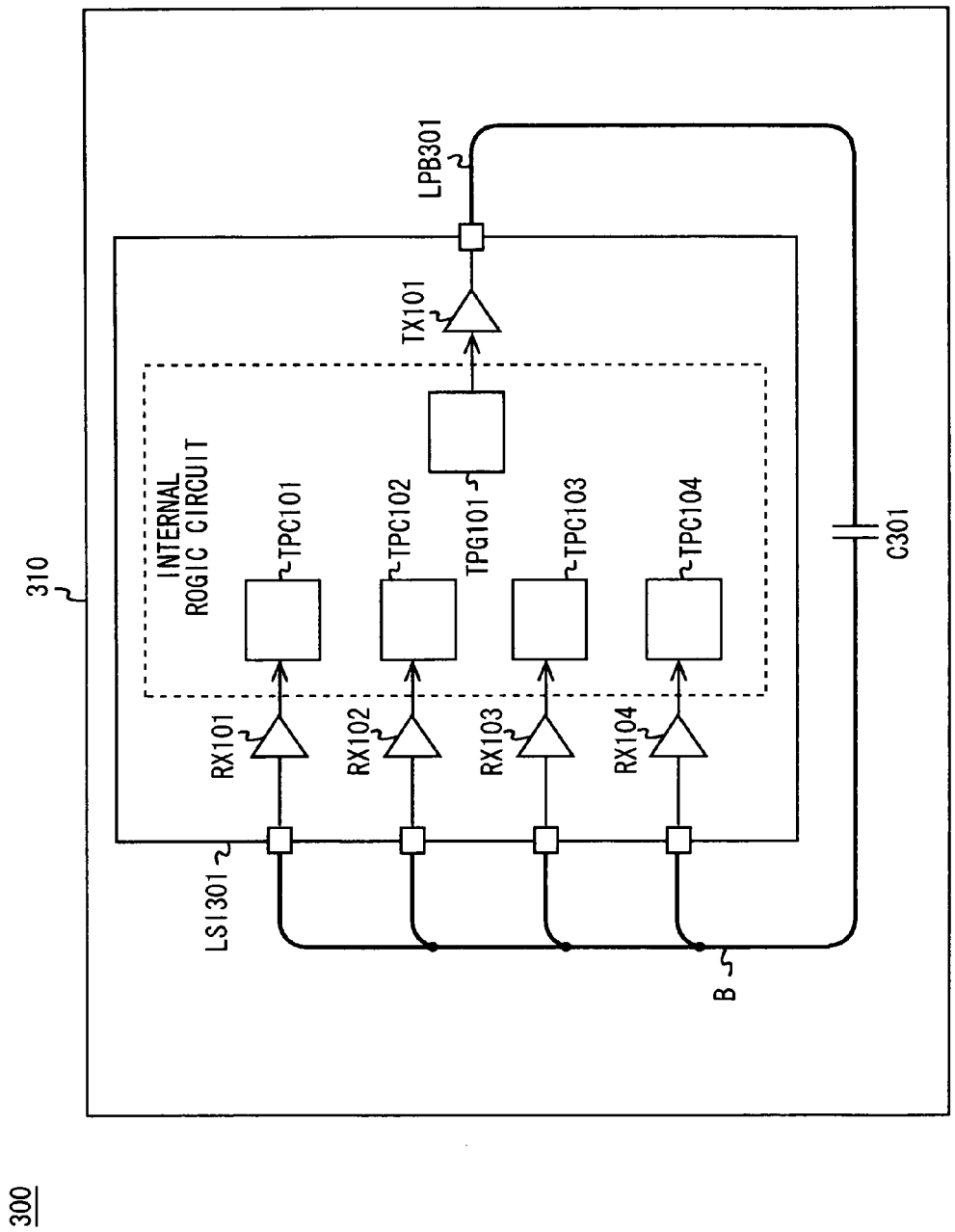
FIG. 7 is a schematic view of a test system according to a third exemplary embodiment.

A third exemplary embodiment of the present invention is described hereinafter in detail with reference to the drawings. FIG. 7 shows a schematic view of a test system 300 for a loop-back test of a semiconductor integrated circuit according to the third exemplary embodiment.

The test system 300 sets a test target semiconductor integrated circuit LSI301 on a test board 310 and conducts a characteristics test of a high-speed I/O. The semiconductor integrated circuit LSI301 includes high-speed input devices RX101 to RX104, a high-speed output device TX101, a test pattern generation device TPG101, and test pattern check devices TPC101 to TPC104. Further, the test board 310 is provided with a loop-back path LPB301.

In FIG. 7, the elements denoted by the same reference symbols as in FIG. 1 are the same or similar elements as those shown in FIG. 1. Although the terminating resistors R101 to R104 are respectively connected to external input terminals of the high-speed input devices RX101 to RX104 according to the first exemplary embodiment, the semiconductor integrated circuit LSI301 does not include the terminating resistors R101 to R104. In the third exemplary embodiment, the difference from the first exemplary embodiment is mainly described, and a redundant description is omitted.

The semiconductor integrated circuit LSI301 has substantially the same configuration as the semiconductor integrated circuit LSI101 except that it does not include the terminating resistors R101 to R104. Note that it is assumed as a precondition that input impedance of the high-speed input devices RX101 to RX104 and impedance viewed from the external input terminals sufficiently match without terminating resistors.

The loop-back path LPB301 includes a coupling capacitor C301. The coupling capacitor C301 is connected between the external output terminal of the high-speed output device TX101 and a node B. The coupling capacitor C301 is used as AC coupling in order to prevent an offset current or an offset voltage of the high-speed output device TX101 from affecting the high-speed input devices RX101 to RX104 and to prevent an offset current or an offset voltage of the high-speed input devices RX101 to RX104 from affecting the high-speed output device TX101.

A test operation of the test system 300 as described above is described hereinbelow. BIST of the test target semiconductor integrated circuit LSI301 is started. The high-speed output device TX101 generates the test pattern transmission signal based on the test pattern generated by the test pattern generation device TPG101 and outputs the signal. The test pattern transmission signal is transmitted to the high-speed input devices RX101 to RX104 through the loop-back path LPB301. The high-speed input devices RX101 to RX104 respectively receive the test pattern transmission signal and regenerate the test patterns. The test pattern check devices TPC101 to TPC104 respectively check the test patterns regenerated by the high-speed input devices RX101 to RX104 and make determination about the occurrence of an error.

By the above operation, the test system 300 can conduct a characteristics test of the high-speed I/O (the high-speed output device TX101 and the high-speed input devices RX101 to RX104) included in the test target semiconductor integrated circuit LSI301.

Figure 8:
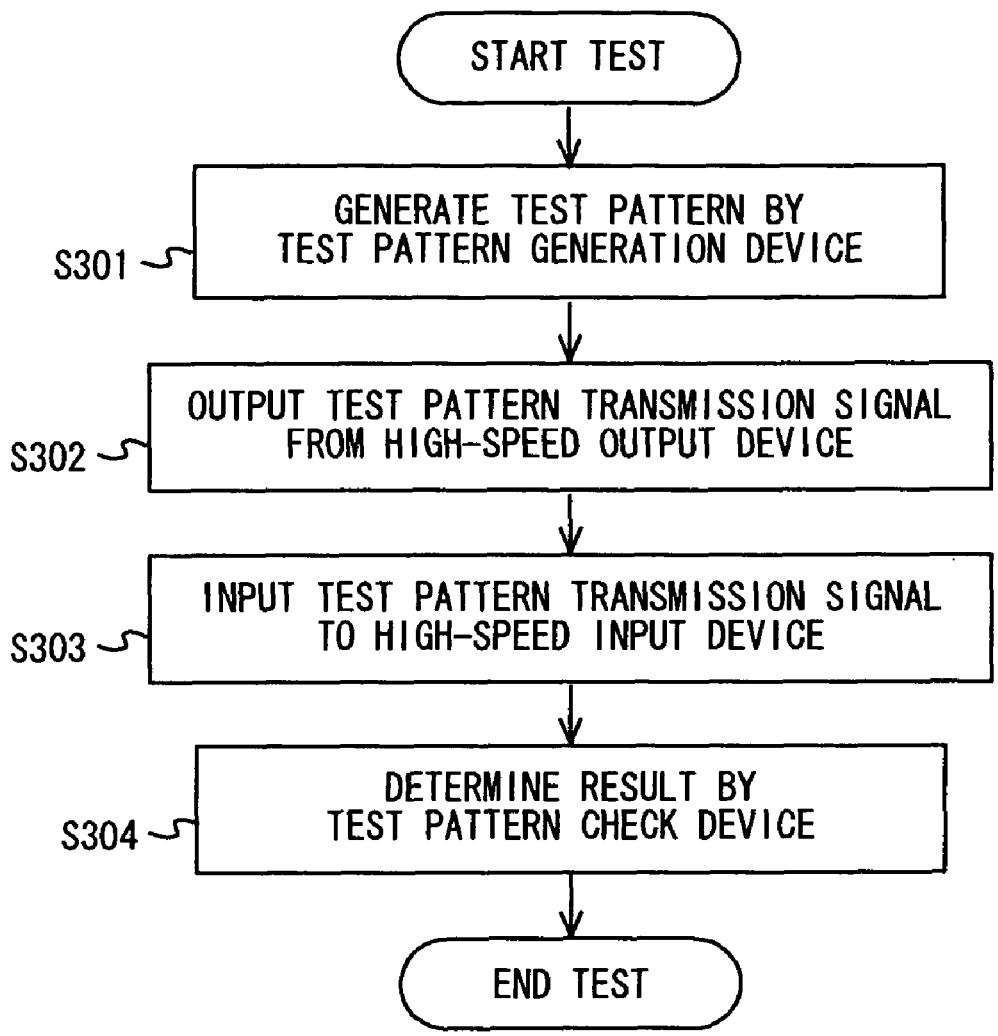
FIG. 8 is a flowchart of a test operation of the test system according to the third exemplary embodiment.

FIG. 8 shows a flowchart of a test operation of the test system 300 described above. The test pattern generation device TPG101 generates a test pattern (S301). The high-speed output device TX101 outputs the test pattern transmission signal (S302). The test pattern transmission signal is input to the high-speed input devices RX101 to RX104 (S303). The test pattern check devices TPC101 to TPC104 check the test pattern and determines a result (S304).

In the above-described test system 300, even when the test target semiconductor integrated circuit includes one high-speed output device TX101 with respect to a plurality of high-speed input devices RX101 to RX104, it is possible to conduct a characteristics test of the high-speed I/O as in the first exemplary embodiment. Further, compared to the first exemplary embodiment, it is possible to perform a characteristics test of the high-speed I/O with the high-speed output device TX101 and the high-speed input devices RX101 to RX104 simultaneously in one-time BIST. It is thus possible to reduce a test period per one semiconductor integrated circuit and, consequently, reduce the test cost.

Figure 9:
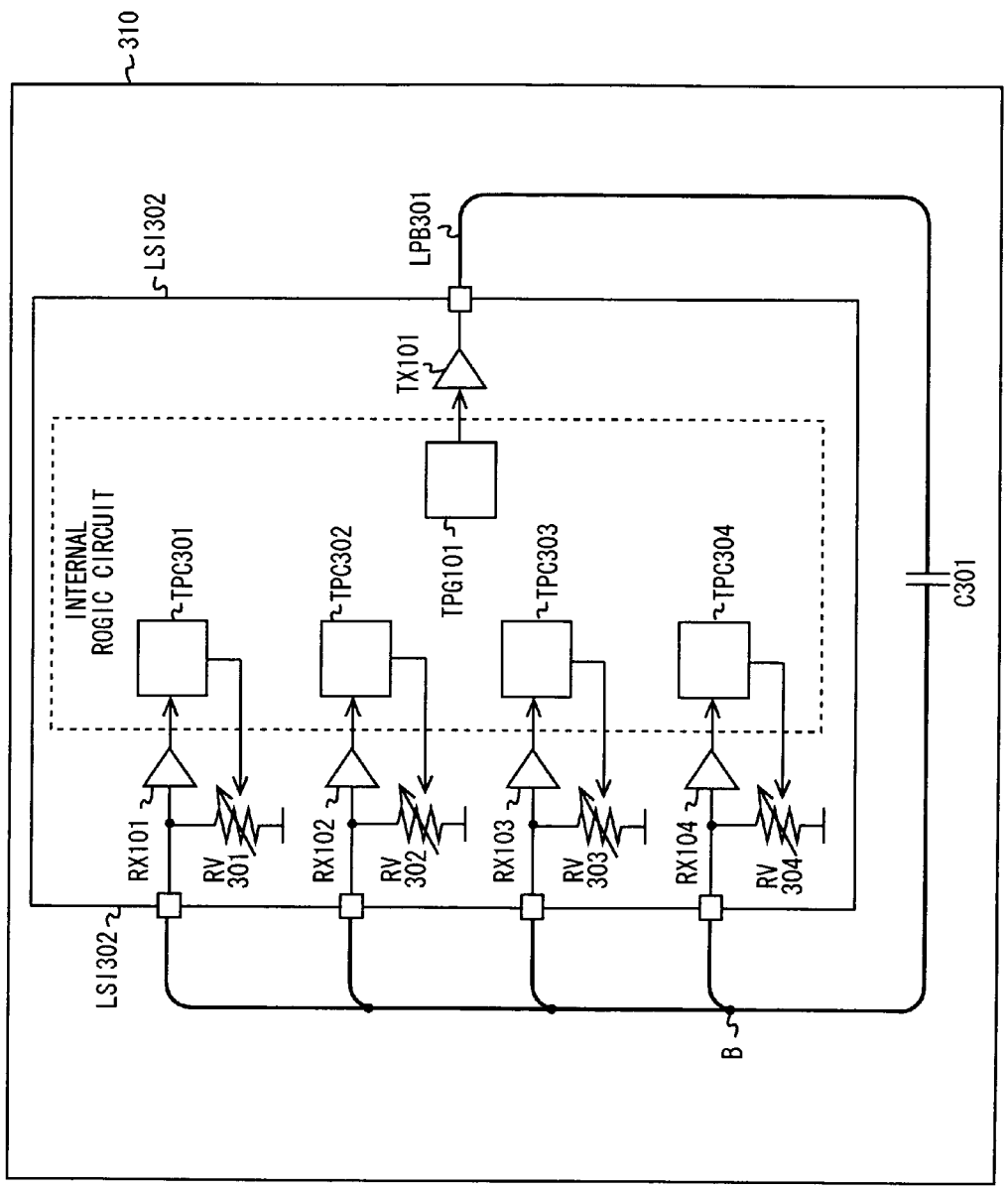
FIG. 9 is a schematic view of another test system according to the third exemplary embodiment.

FIG. 9 shows a schematic view of a test system 301 in the case where it is necessary to match the impedances of a plurality of high-speed input devices included in a test target semiconductor integrated circuit. As shown in FIG. 9, a semiconductor integrated circuit LSI302, which is a test target in the test system 301, includes high-speed input devices RX101 to RX104, a high-speed output device TX101, a test pattern generation device TPG101, and test pattern check devices TPC301 to TPC304. Further, variable resistors RV301 to RV304 serving as terminating resistors are connected to external input terminals of the high-speed input devices RX101 to RX104. One ends of the variable resistors RV301 to RV304 are connected to the external input terminals, and the other ends are connected to a ground voltage or a power supply voltage. The elements denoted by the same reference symbols as in FIG. 7 are the same elements as those of the test system 300.

The variable resistors RV301 to RV304 may be MOS transistors or the like where a bias voltage with a predetermined voltage value is applied to its gate. A resistance value is adjusted by the voltage value of the bias voltage. Further, a plurality of MOS transistors may be connected in parallel. In this case, a resistance value is calculated by the combined resistance of "on" or "off" transistors. Further, on/off of the variable resistors RV301 to RV304 and setting of the resistance value may be controlled in the test pattern check devices TPC301 to TPC304. Note that the test pattern check devices TPC301 to TPC304 may be regarded as one check device.

A test operation of the test system 301 as described above is described hereinbelow. In this example, a case is assumed where on/off of the variable resistors RV301 to RV304 is controlled in the test pattern check devices TPC301 to TPC304.

First, before starting BIST of the semiconductor integrated circuit LSI302, the test pattern check device TPC301 sets the variable resistor RV301 to the on-state, and the test pattern check devices TPC302 to TPC304 set the variable resistors RV302 to RV304 to the off-state. Next, BIST of the test target semiconductor integrated circuit LSI302 is started. The high-speed output device TX101 generates the test pattern transmission signal based on the test pattern generated by the test pattern generation device TPG101 and outputs the signal. The test pattern transmission signal is transmitted to the high-speed input devices RX101 to RX104 through the loop-back path LPB301.

Because only the variable resistor RV301 is in the on-state as described above, it is the high-speed input device RX101 to which the test pattern generated by the test pattern generation device TPG101 can be accurately input. Therefore, only the high-speed input device RX101 regenerates the test pattern from the test pattern transmission signal, and the test pattern check device TPC301 checks the test pattern and makes determination about the occurrence of an error.

Note that, although all of the high-speed input devices RX101 to RX104 may regenerate the test patterns from the test pattern transmission signal, it is still only the test pattern check device TPC301 that checks the test pattern and makes determination about the occurrence of an error in this case also.

Next, the test pattern check device TPC302 sets only the variable resistor RV302 to the on-state, and BIST is conducted. Then, only the high-speed input device RX102 regenerates the test pattern from the test pattern transmission signal, and only the test pattern check device TPC302 checks the test pattern and makes determination about the occurrence of an error.

After that, the test pattern check device TPC303 sets only the variable resistor RV303 to the on-state, and BIST is conducted. Then, only the high-speed input device RX103 regenerates the test pattern from the test pattern transmission signal, and only the test pattern check device TPC303 checks the test pattern and makes determination about the occurrence of an error.

Finally, the test pattern check device TPC304 sets only the variable resistor RV304 to the on-state, and BIST is conducted. Then, only the high-speed input device RX104 regenerates the test pattern from the test pattern transmission signal, and only the test pattern check device TPC304 checks the test pattern and makes determination about the occurrence of an error.

By the above operation, the test system 301 can conduct a characteristics test of the high-speed I/O (the high-speed output device TX101 and the high-speed input devices RX101 to RX104) included in the test target semiconductor integrated circuit LSI302.

Figure 10:
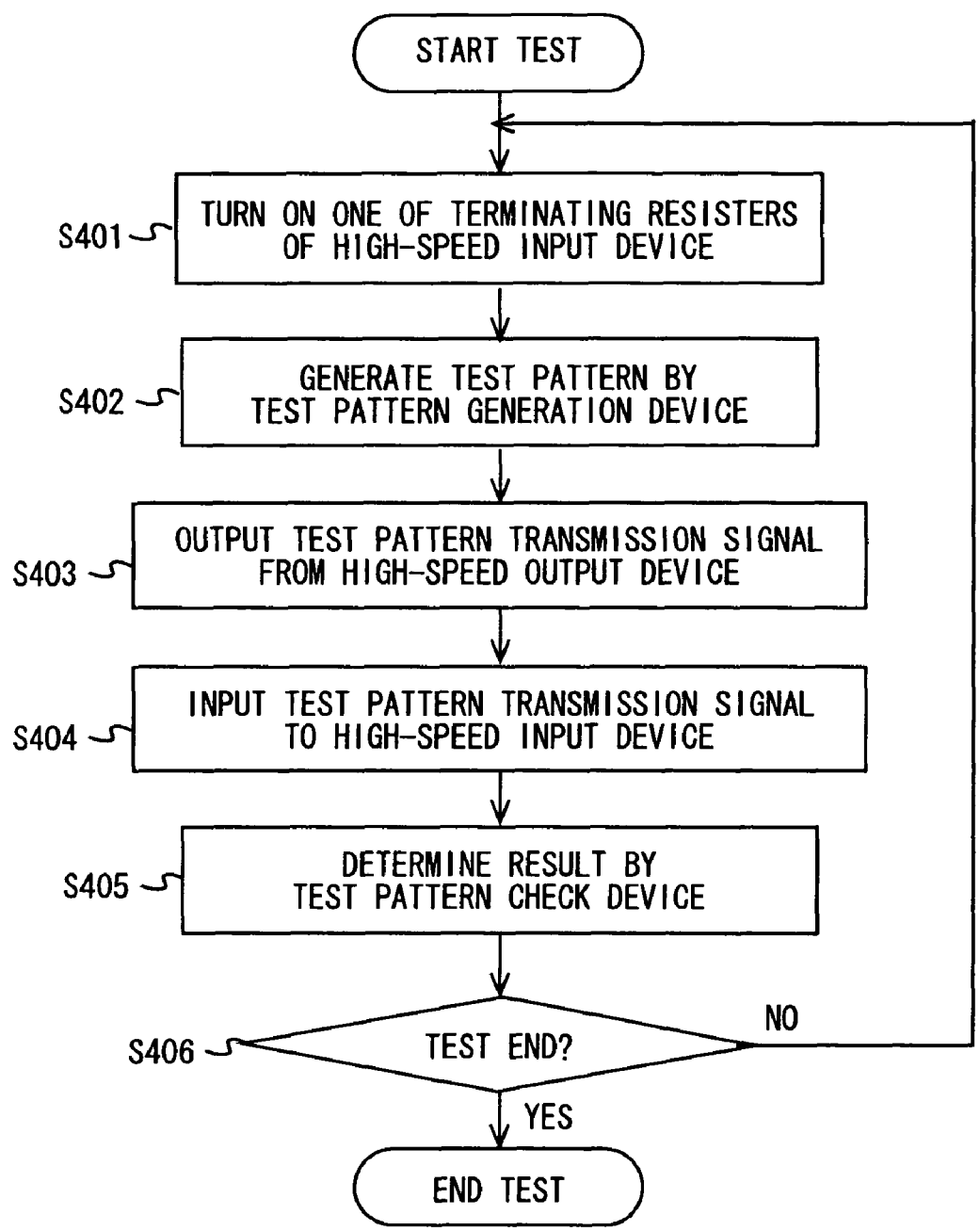
FIG. 10 is a flowchart of a test operation of another test system according to the third exemplary embodiment.

FIG. 10 shows a flowchart of a test operation of the test system 301 described above. First, one of the variable resistors RV301 to RV304 is set to the on-state by the corresponding test pattern check device (S401). The test pattern generation device TPG101 generates a test pattern (S402). The high-speed output device TX101 outputs the test pattern transmission signal (S403). The test pattern transmission signal is input to the high-speed input device corresponding to the variable resistor that is set to the on-state in the step S401 (S404). Then, the test pattern check device corresponding to the high-speed input device checks the test pattern and determines a result (S405). If a characteristics test is conducted on the whole high-speed I/O (the high-speed output device TX101 and the high-speed input devices RX101 to RX104), the test ends (YES in S406). If, on the other hand, a characteristics test is not conducted on the whole high-speed I/O, the process returns to the step S401 and conducts a characteristics test with the high-speed output device TX101 and another high-speed input device (NO in S406).

In the above-described test system 301, because there is no need for the selection switches on the test board, it is possible to reduce the manufacturing cost of the test board compared to the test system 100 according to the first exemplary embodiment. Further, in this case, a characteristics test of the high-speed I/O may be conducted by setting a plurality of variable resistors to the on-state rather than setting one of the variable resistors RV301 to RV304 to the on-state as described above. In this case, however, it is necessary to adjust the resistance value according to the number of variable resistors to be turned on.

The present invention is not limited to the above-described exemplary embodiments, and various changes and modifications may be made without departing from the scope of the invention. For example, although terminating resistors are included in the semiconductor integrated circuit in the first to third exemplary embodiments described above, they may be placed on the test board. Further, although the case where the number of a plurality of high-speed output devices or the number of a plurality of high-speed input devices is four in the first to third exemplary embodiments, the number may be larger than four, or two or three.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first to third exemplary embodiments can be combined as desirable by one of ordinary skill in the art.

What is claimed is:

1. A test system of a semiconductor integrated circuit comprising an output device and an input device for conducting an input/output characteristics test of the output device and the input device inside the semiconductor integrated circuit, the test system comprising:
a test board where the semiconductor integrated circuit is mounted on; and a transmission line that is provided in the test board and that establishes a wired connection between an external terminal of one circuit of one of the output device and the input device and external terminals of a plurality of circuits of another one of the output device and the input device, wherein the transmission line comprises a plurality of selection switches that are connected between the external terminal of one circuit of said one of the output device and the input device and the external terminals of the plurality of circuits of said another one of the output device and the input device, and that are controlled so that, when at least one selection switch is in an on-state, other selection switches are in an off-state.

2. The test system according to claim 1, wherein the plurality of circuits of said another one of the output device and the input device have a function of enabling or disabling a signal output or a signal input, and are controlled so that, when at least one of the plurality of circuits of said another one of the output device and, the input device is enabled, other circuits are disabled.

3. A test system of a semiconductor integrated circuit comprising an output device and an input device for conducting an input/output characteristics test of the output device and the input device inside the semiconductor integrated circuit, the test system comprising:

a test board where the semiconductor integrated circuit is mounted on; and a transmission line that is provided in the test board and that establishes a wired connection between an external terminal of one circuit of one of the output device and the input device and external terminals of a plurality of circuits of another one of the output device and the input device, wherein the transmission line comprises a coupling capacitor connected between the external terminal of one circuit of said one of the output device and the input device and the external terminals of the plurality of circuits of said another one of the output device and the input device.

4. The test system according to claim 3, wherein a plurality of circuits of the input device comprise terminating resistors respectively connected to the external terminals, and the terminating resistors have a function of turning on or off as resistors and are controlled so that, when at least one resistor is in an on-state, other resistors are in an off state.

5. The test system according to claim 4, wherein the semiconductor integrated circuit comprises:

a test pattern generation circuit that generates a test pattern of a transmission signal to be transmitted from one circuit of the output device; and a check circuit that checks a test pattern regenerated by the plurality of circuits of the input device based on the transmission signal from the output device, and the check circuit checks the test pattern regenerated by the input device comprising the terminating resistor in an on-state among the plurality of circuits of the input device.

6. The test system according to claim 4, wherein the terminating resistors comprise variable resistors and are adjustable to have a resistance value corresponding to characteristics of the transmission line during an on-state.

* * * * *